United States Patent
Song et al.

(10) Patent No.: US 7,253,705 B2
(45) Date of Patent: *Aug. 7, 2007

(54) AIR-GAP TYPE THIN-FILM BULK ACOUSTIC RESONATOR AND FABRICATION METHOD THEREFOR

(75) Inventors: In-sang Song, Seoul (KR); Byeoung-ju Ha, Yongin-si (KR); Yun-kwon Park, Dongducheon-si (KR); Jong-seok Kim, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

This patent is subject to a terminal disclaimer.

(21) Appl. No.: 11/130,157

(22) Filed: May 17, 2005

(65) Prior Publication Data

US 2005/0253670 A1   Nov. 17, 2005

(30) Foreign Application Priority Data

May 17, 2004   (KR) .................. 10-2004-0034969

(51) Int. Cl.
*H03H 9/15* (2006.01)
*H03H 3/02* (2006.01)
*H03H 9/54* (2006.01)

(52) U.S. Cl. .............. 333/187; 216/17; 29/25.35; 310/324

(58) Field of Classification Search ............ 333/187; 310/324; 216/13, 17
See application file for complete search history.

(56) References Cited

U.S. PATENT DOCUMENTS

| | | | |
|---|---|---|---|
| 7,053,456 B2* | 5/2006 | Matsuo ................. | 257/415 |
| 2003/0015941 A1 | 1/2003 | Nakatani et al. | |
| 2005/0218755 A1* | 10/2005 | Song et al. ............ | 310/348 |
| 2005/0253668 A1* | 11/2005 | Song et al. ............ | 333/133 |

FOREIGN PATENT DOCUMENTS

EP   1 291 317 A2   3/2003
KR   10-2005-0098056 A   10/2005

* cited by examiner

*Primary Examiner*—Barbara Summons
(74) *Attorney, Agent, or Firm*—Sughrue Mion, PLLC

(57) ABSTRACT

An air-gap type thin-film bulk acoustic resonator. The air-gap type thin-film bulk acoustic resonator has a substrate having a cavity formed on a predetermined portion of an upper surface thereof; a resonance part having a structure of a first electrode, a piezoelectric substance, and a second electrode deposited in order and formed over the upper side of the cavity; and at least one via hole penetrating a lower surface of the substrate and connecting to the cavity.

10 Claims, 3 Drawing Sheets

AIR-GAP TYPE THIN-FILM BULK ACOUSTIC RESONATOR AND FABRICATION METHOD THEREFOR

This application claims benefit under 35 U.S.C. § 119 from Korean Patent Application No. 2004-34969, filed on May 17, 2004, the entire content of which is incorporated herein by reference.

BACKGROUND OF THE INVENTION

1. Field of the Invention

The present invention relates to a thin-film bulk acoustic resonator (FBAR) and fabrication method therefore. More particularly, the present invention relates to an air-gap type thin-film acoustic resonator including a substrate having an air-gap formed in an upper portion of the substrate and a fabrication method therefor, wherein the air gap is formed by etching the substrate through a via hole extending into the substrate from a lower surface thereof.

2. Description of the Related Art

Recently, mobile communication devices such as mobile phones have become widely used, and there is a need for smaller-sized and light-weight filters for use in such devices. FBARs are known as being suitable for such small-sized and light-weight filters, and are advantageous in that they can be mass produced at minimum cost and in small size. Further, such FBARs are advantageous in that they can be fabricated to have a high quality factor Q which is a primary characteristic of such filters, for use in micro-frequency bands, and, particularly fabricated to cover even bands for personal communication systems (PCSs) and digital cordless systems (DCSs).

In general, the FBAR device is fabricated by forming a lower electrode, a piezoelectric layer, and an upper electrode which are deposited in order over a substrate. The operation principle of the FBAR device is as follows: Resonance is generated by applying electric energy to the electrodes to induce within the piezoelectric layer an electromagnetic field which varies with time to generate bulk acoustic waves in the vibration direction of the resonance part.

FIG. 1A is a cross-sectioned view of a Bragg-reflector FBAR which is a type of FBAR. In FIG. 1A, the Bragg-reflector FBAR has a substrate 10, reflection layers 11, a lower electrode 12, a piezoelectric layer 13, and an upper electrode 14. In the Bragg-reflector FBAR, acoustic waves generated from the piezoelectric layer 13 are not propagated in the substrate direction, but are reflected from the reflection layers 11, so that effective resonance can be generated. In its fabrication process, first, substances having a large acoustic impedance difference therebetween are deposited over the substrate 10 to form the reflection layers 11, and then the lower electrode 12, piezoelectric layer 13, and upper electrode 14 are deposited in order, so that a resonance part is formed over the reflection layers 11. The Bragg-reflector FBAR is sturdy in structure and does not exhibit stress upon being bent, but has a drawback in that it is difficult to precisely form more than four reflection layers for total reflection and much time and expense is required for its fabrication.

Thus, the air-gap type FBAR has been investigated which uses an air gap instead of a reflection layer, to isolate the substrate from the resonance part. FIG. 1B and FIG. 1C are cross-sectional views which illustrate the structure of a conventional air-gap type FBAR.

The FBAR having a structure shown in FIG. 1B has an air gap 21 under the resonance part formed with a lower electrode 23, a piezoelectric layer 24, and an upper electrode 25 deposited in order, isolating the resonance part from the substrate 20. In the process of fabricating the FBAR, first, a sacrificial layer (not shown) is deposited and patterned over the substrate 20, so predetermined portions of the layer remain on the substrate 20. Next, an insulation layer 22 is deposited on a sacrificial layer and substrate 20, and a lower electrode 23, piezoelectric layer 24, and upper electrode 25 are deposited in order to form a resonance part. The insulation layer 22 serves as a membrane layer supporting the resonance part. Finally, the sacrificial layer is removed to form an air gap 21. That is, a via hole is formed from the outer surface of the substrate to the inner sacrificial layer, and the sacrificial layer is removed by injecting etching solution through the via hole, so that an air gap 21 is formed in place of the sacrificial layer. Further, U.S. Pat. No. 6,355,498 discloses applying an anti-etching material on the substrate 20 which enables the air gap to be adjusted in size and position when fabricating an air-gap type FBAR having a structure as shown in FIG. 1B.

However, such FBAR fabrication process is complicated because a sacrificial layer is needed. Further, the filter design is restrained since the via hole has to be formed on the membrane layer around the resonator. Further, chemical damage can occur to the resonance part since etching is performed through a via hole formed just near the resonance part.

On the other hand, FIG. 1C is a cross-sectional view of the air-gap type FBAR disclosed in U.S. Pat. No. 6,060,818. In FIG. 1C, a photoresist layer is used to form a cavity 35 when etching is applied to a predetermined portion of the substrate 30. Next, an insulation layer 31 is deposited over the entire upper surface of the substrate 30 on which the cavity 35 is formed. Next, after filling a sacrificial substance in the cavity 35, the lower electrode 32, piezoelectric layer 33, and upper electrode 34 are deposited in order over the sacrificial layer and insulation layer 31 to form a resonance part. Next, a via hole is formed through the insulation layer 31 near the resonance part, and the sacrificial substance is etched away through the via hole to form the air gap 35. However, use of a sacrificial substance makes the process complicated, and the resonance part is subject to chemical damage as well due to the etching. Further, part of the insulation layer can remain below the resonance part, which can degrade resonance characteristics.

SUMMARY OF THE INVENTION

The present invention has been developed in order to solve the above drawbacks and other problems associated with conventional FBAR structures. It is therefore an object of the present invention to provide an air-gap type FBAR and fabrication method therefor in which a via hole is formed through the lower surface of the substrate to form an air-gap, so that the FBAR can be fabricated using a simplified process yet provide excellent resonance characteristics.

The foregoing and other objects and advantages of the invention have been achieved by providing an air-gap type thin film bulk acoustic resonator, comprising a substrate having a cavity formed at a predetermined portion of an upper surface thereof; a resonance part having a structure of a first electrode, a piezoelectric substance, and a second electrode deposited in order, and formed over an upper surface of the cavity; and at least one via hole penetrating a lower surface of the substrate and connecting to the cavity.

In the invention, an area of the substrate occupied by the cavity is preferably larger than that of the resonance part.

Further, the air-gap type thin-film bulk acoustic resonator further preferably comprises a packaging substrate bonded on the lower surface of the substrate to close the via hole and prevent foreign material from entering into the cavity.

Further, the air-gap type thin-film bulk acoustic resonator further preferably comprises an insulation layer deposited over the upper surface of the substrate exclusive of an area on which the cavity is formed. The insulation layer separates the first and second electrodes constituting the resonance part from the substrate.

Furthermore, in a preferred embodiment, the resonance part is supported by the first electrode and the piezoelectric layer, each of which are in contact with the upper surface of the insulation layer.

The above objects of the invention have also been achieved by providing a method for fabricating an air-gap type thin film bulk acoustic resonator which comprises the steps of (a) depositing an insulation layer over an upper surface of a substrate; (b) depositing a first electrode, a piezoelectric layer, and a second electrode in order over the insulation layer to form a resonance part; (c) forming at least one via hole penetrating a lower surface of the substrate; and (d) etching the substrate and insulation layer formed below the resonance part through the via hole to form a cavity.

Preferably, the method of the invention further comprises a step of bonding a packaging substrate on the lower surface of the substrate to close the via hole.

Further, step (d) preferably comprises etching the substrate so that an area of the substrate occupied by the cavity is larger than that of the resonance part.

Further preferably, at least one of the first and second electrodes constituting an air-gap type thin-film bulk acoustic resonator comprises at least one of aluminum (Al), tungsten (W), gold (Au), platinum (Pt), nickel (Ni), titanium (Ti), chromium (Cr), palladium (Pd), and molybdenum (Mo).

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Hereinafter, the present invention will be described in detail with reference to the accompanying drawings. However, the present invention should not be construed as being limited thereto.

Figure 1A:
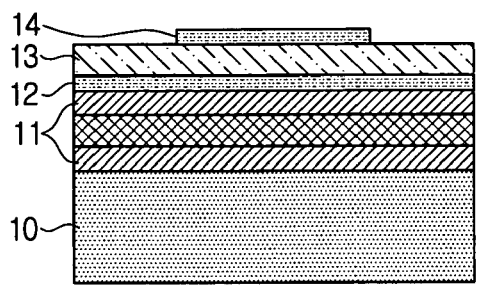
FIG. 1A is a cross-sectional view of a conventional Bragg reflector FBAR.
Figure 1B:
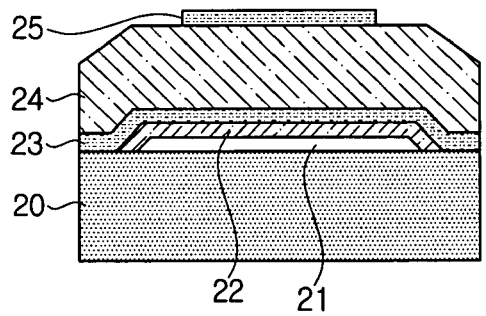
FIG. 1B and FIG. 1C are cross-sectional views of an air-gap type FBAR fabricated in a conventional process.
Figure 1C:
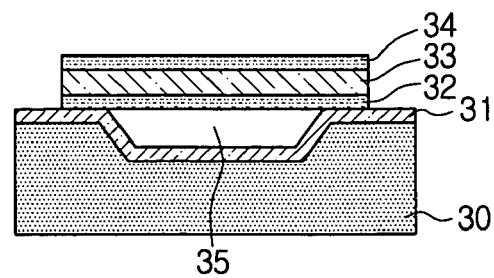
Figure 2:
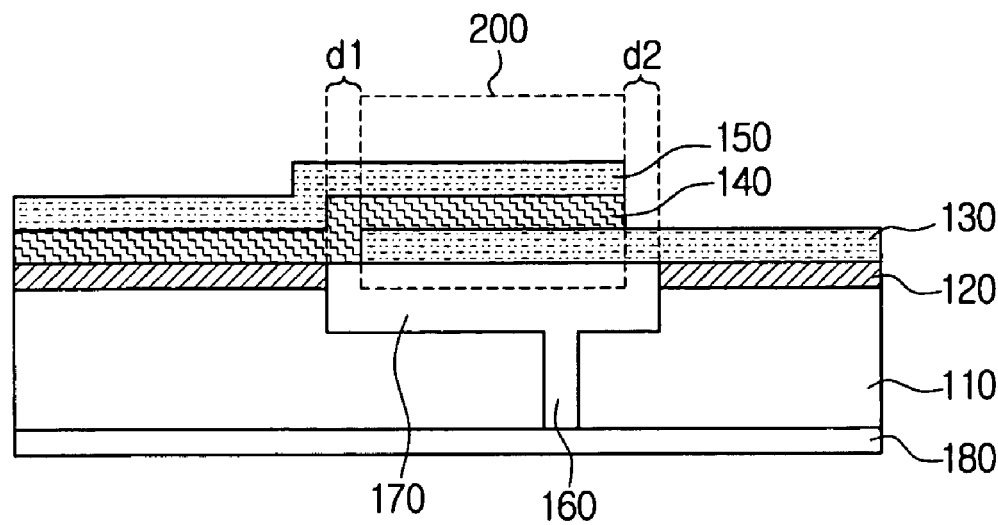
FIG. 2 is a cross-sectional view for an air-gap type FBAR according to an embodiment of the present invention.

FIG. 2 is a cross-sectional view of an air-gap type thin-film bulk acoustic resonator (FBAR) according to an embodiment of the present invention. In FIG. 2, the air-gap type FBAR has a substrate 110 having a cavity 170, an insulation layer 120, a first electrode 130, a piezoelectric layer 140, and a second electrode 150.

A resonance part 200 is formed over the cavity 170, having the first electrode 130, piezoelectric layer 140, and second electrode 150 deposited in order. As discussed above, the resonance part 200 filters a wireless signal utilizing the piezoelectric effect of the piezoelectric layer 140. That is, a radio frequency (RF) signal applied through the second electrode 150 can be outputted in the direction of the first electrode 130 through the resonance part 200. Since the resonance part 200 has a constant resonance frequency depending on the vibration occurring in the piezoelectric layer 140, only a signal resonant with a resonance frequency of the resonance part 200 is outputted from the input RF signal.

Meanwhile, the first electrode 130, piezoelectric layer 140, and second electrode 150 constituting the resonance part 200 contact the insulation layer 120 deposited over the substrate surface around the cavity 170. Accordingly, the resonance part 200 is supported by the insulation layer 120. As shown in FIG. 2, the first electrode 130 and piezoelectric layer 140 can be formed so as to be in contact with the insulation layer 120. Further, the piezoelectric layer 140 present on a certain part of the first electrode 130 can be removed to form a pad electrically connected to an external electrode.

As discussed above, the piezoelectric layer 140 exhibits a piezoelectric effect which converts electric energy into mechanical energy of acoustic form. Aluminum nitride (AlN), zinc oxide (ZnO), and the like piezoelectric substances can be used to form the piezoelectric layer 140.

Meanwhile, an insulation layer 120 made of a certain insulating substance is formed between the first and second electrodes 130 and 150 and the substrate 110 in order to isolate the first and second electrodes 130 and 150 and the substrate 110. Silicon dioxide ($SiO_2$), alumina ($Al_2O_3$), and the like insulating substances can be used to form the insulation layer 120. Further, a RF magnetron sputtering method or evaporation method can be used to deposit insulation layer 120 over the substrate 110.

A conductive substance known to those skilled in the art such as a metal can be used to form the first and second electrodes 130 and 150, including, for example, aluminum (Al), tungsten (W), gold (Au), platinum (Pt), nickel (Ni), titanium (Ti), chromium (Cr), magnesium (Mg), palladium (Pd) and molybdenum (Mo).

Meanwhile, a silicon substrate, for example, can be used for the substrate 110. The cavity 170 is formed over a certain part of the substrate 110. In this embodiment, in order to form the cavity 170, a via hole 160 is formed through the lower surface of the substrate 110 where the resonance part 200 is not formed. Etching solution or gas is injected through the via hole 160 to etch away a portion of the substrate 110 below the resonance part 200, so that the cavity 170 is formed. Since the via hole 160 is formed at the lower surface of the substrate 110, the etching gas is absorbed in the piezoelectric layer 140 during the etching process, to solve the problem of possible chemical damage to the piezoelectric layer 140.

Meanwhile, the etching process is performed for a period of time long enough to completely etch away the insulation layer 120 present at the lower surface of the resonance part 200. Consequently, a part of the substrate 110 is also etched so that it is spaced at a distance d1 or d2 from resonance part 200, which can enhance the resonance characteristics.

Further, in order to prevent dust or the like from entering the via hole 160 formed at the lower surface of the substrate 110, a packaging substrate 180 can be bonded to the lower surface of the substrate 110. A silicon substrate can be used for the packaging substrate 180. It is possible to use a direct bonding method of heating and bonding the packaging substrate 180, an anodic bonding method of applying voltages to and bonding the same, a method of using an adhesive such as epoxy or the like to bond the same, an eutectic bonding method of using metal to bond the same, or the like, but it is preferable to use the adhesive or eutectic bonding method allowing for a low-temperature process. This is because the direct bonding method and the anodic bonding method require a relatively high-temperature process.

Figure 3A:
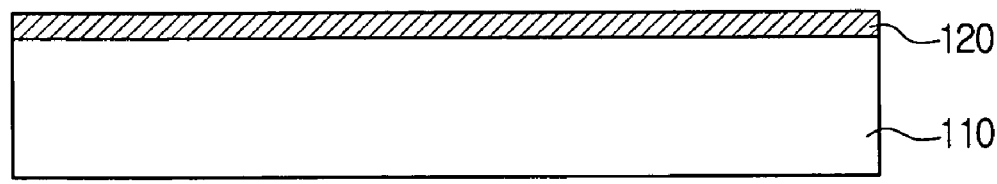
FIG. 3A to 3D are cross-sectional views illustrating a process for fabricating an air-gap type FBAR of FIG. 2.

FIG. 3A to FIG. 3D are cross-sectional views illustrating step by step a process of fabricating the air-gap type FBAR shown in FIG. 2. In FIG. 3A, the insulation layer 120 is deposited over the entire upper surface of the substrate 110. The substance and method of depositing the insulation layer 120 are described above.

Figure 3B:
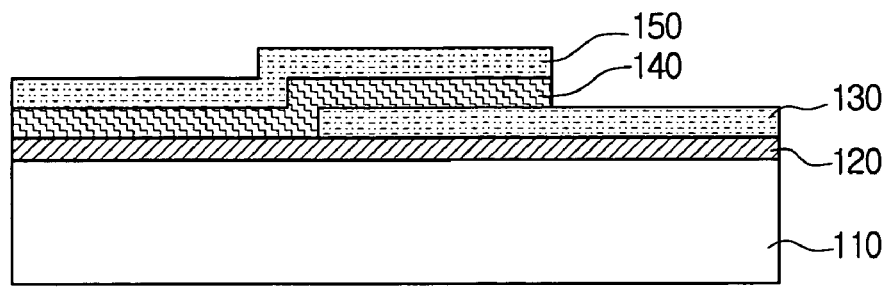

Next, as shown in FIG. 3B, the first electrode 130, piezoelectric layer 140, and second electrode 150 are deposited in order over the insulation layer 120. To do so, the first electrode 130 is deposited over the entire upper surface of the insulation layer 120, and patterned, in order to expose a portion of the insulation layer 120. The patterning will typically employ a photoresist masking layer and a development and etching process of forming a predetermined pattern by etching away only exposed portions not protected by the photoresist.

Next, the piezoelectric layer 140 is deposited over the entire surface of the exposed insulation layer 120 and first electrode 130, and patterned so that a certain portion of the first electrode 130 is exposed. Next, a patterning process is used to deposit the second electrode 150 over a predetermined portion of the piezoelectric layer 140. FIG. 3B shows second electrode 150 deposited over the entire upper surface of the piezoelectric layer 140, but it is possible to deposit the second electrode 150 only over the piezoelectric layer 140 under which the first electrode 130 is placed. The resonance part 200 is thereby formed when the first electrode 130, piezoelectric layer 140, and second electrode 150 are deposited in order.

Figure 3C:
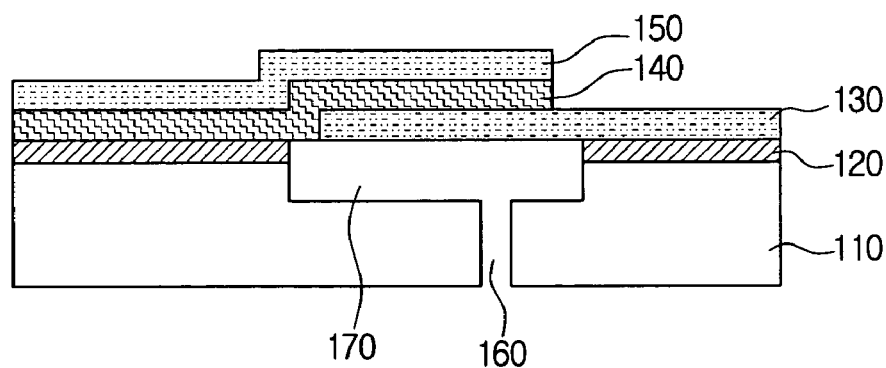

FIG. 3C is a cross-sectional view showing a process of forming the air gap 170 by use of the via hole 160. In FIG. 3C, at least one via hole 160 is formed at the lower surface and in the thickness direction of the substrate 110. A reactive ion etching (RIE) method can be used to form the via hole. The RIE method is an etching method by which a volatile substance is generated by etching with a chemically reactive, activated plasma. Particularly, an inductively coupled plasma reactive ion etching method (hereinafter, referred to as 'ICP-RIE' method) can be used in which an inductively coupled plasma (ICP) serves as an activation source. The ICP-RIE method is a kind of dry etching method and exhibits no etching anisotropy, providing an advantage of greatly increasing the degree of design freedom in forming a structure as compared to use of a wet etching method (which typically will result in etching anisotropy).

Next, via hole 160 thus formed is used to etch the substrate 110 and insulation layer 120 formed below the resonance part 200, and such etching forms an air gap 170. A wet etching method or dry etching method can be used. The wet etching method introduces a chemical solution such as acetic acid solution, hydrofluoric acid, phosphoric acid solution, or the like into the via hole, and the dry etching method refers to an etching method of using gas, plasma, ion beams, or the like. Herein, the etching is performed for a long enough period of time so that substrate 110 is spaced at distances d1 and d2 from the lower surface of the resonance part 200.

Figure 3D:
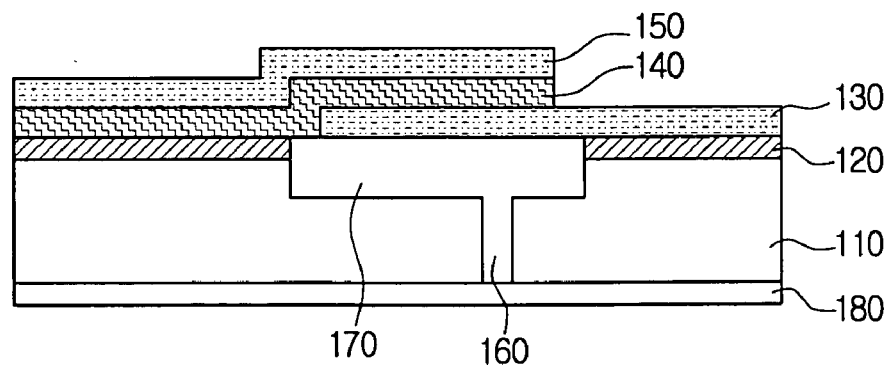

FIG. 3D is a view showing a process of bonding the packaging substrate 180. The bonding of the packaging substrate 180 can prevent foreign material from entering the air gap 170 through the via hole 160.

Thus, the air-gap type FBAR shown in FIG. 2 can be finally fabricated. The fabricated air-gap type FBAR filters only RF signals of a predetermined frequency band. Accordingly, a band-pass filter can be implemented to have a certain center frequency and a frequency bandwidth when plural air-gap type FBARs are properly combined in series and in parallel. Further, a duplexer can even be implemented by combining such band-pass filters with a phase shifter constructed with inductors and capacitors.

As stated above, according to the present invention, the air-gap type FBAR can be fabricated by etching the substrate by means of a via hole formed in the lower surface of the substrate. Thus, the air-gap type FBAR can be fabricated to have the desired function using a simple process and without the need for a sacrificial layer. Further, the present invention can minimize damage to the piezoelectric layer and other structures when forming an air gap, and enhance resonance characteristics by completely removing an insulation substance formed under the resonance part.

The foregoing embodiments and advantages are merely exemplary and are not to be construed as limiting the present invention. The present teachings can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An air-gap type thin-film bulk acoustic resonator, comprising:
    a substrate having a cavity formed at a predetermined portion of an upper surface thereof;
    a resonance part comprising a first electrode, a piezoelectric substance, and a second electrode deposited in order, the resonance part being spaced at a predetermined distance from a lower surface of the cavity; and
    at least one via hole penetrating a lower surface of the substrate and connecting to the cavity.

2. The air-gap type thin-film bulk acoustic resonator as claimed in claim 1, wherein an area of the substrate occupied by the cavity is larger than an area of the substrate occupied by the resonance part.

3. The air-gap type thin-film bulk acoustic resonator as claimed in claim 2, further comprising a packaging substrate bonded to the lower surface of the substrate which closes the via hole.

4. The air-gap type thin-film bulk acoustic resonator as claimed in claim 2, further comprising an insulation layer deposited on the upper surface of the substrate exclusive of an area on which the cavity is formed.

5. The air-gap type thin-film bulk acoustic resonator as claimed in claim 4, wherein the resonance part is supported by the first electrode and the piezoelectric layer, each of which are in contact with the upper surface of the insulation layer.

6. The air-gap type thin-film bulk acoustic resonator as claimed in claim 1, wherein the first and second electrodes comprise at least one metal selected from the group consisting of Al, W, Au, Pt, Ni, Ti, Cr, Pd and Mo.

7. A method for fabricating an air-gap type thin-film bulk acoustic resonator which comprises:
    (a) depositing an insulation layer over an upper surface of a substrate;

(b) depositing a first electrode, a piezoelectric layer, and a second electrode in order over the insulation layer to form a resonance part;

(c) forming at least one via hole penetrating a lower surface of the substrate; and (d) etching the substrate and insulation layer formed below the resonance part through the via hole to form a cavity.

8. The method as claimed in claim 7, which further comprises bonding a packaging substrate on the lower surface of the substrate to close the via hole.

9. The method as claimed in claim 7, wherein step (d) comprises etching the substrate in such manner that an area of the substrate occupied by the cavity is larger than an area of the substrate occupied by the resonance part.

10. The method as claimed in claim 7, wherein step (b) comprises depositing at least one metal selected from the group consisting of Al, W, Au, Pt, Ni, Ti, Cr, Pd and Mo to form one or both of the first and second electrodes.

* * * * *